United States Patent
Hama et al.

(10) Patent No.: US 9,646,824 B2
(45) Date of Patent: May 9, 2017

(54) METHOD FOR MANUFACTURING SEMICONDUCTOR DEVICE

(71) Applicant: Renesas Electronics Corporation, Kawasaki-shi (JP)

(72) Inventors: Masaki Hama, Kawasaki (JP); Yasuaki Kagotoshi, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/595,891

(22) Filed: Jan. 13, 2015

(65) Prior Publication Data
US 2015/0214047 A1   Jul. 30, 2015

(30) Foreign Application Priority Data
Jan. 29, 2014 (JP) ................................ 2014-014508

(51) Int. Cl.
*H01L 21/336* (2006.01)
*H01L 21/02* (2006.01)
*H01L 29/66* (2006.01)
*H01L 29/16* (2006.01)
(Continued)

(52) U.S. Cl.
CPC .. *H01L 21/02332* (2013.01); *H01L 21/02337* (2013.01); *H01L 21/049* (2013.01); *H01L 29/1608* (2013.01); *H01L 29/66068* (2013.01); *H01L 29/66712* (2013.01); *H01L 29/66734* (2013.01); *H01L 29/78* (2013.01); *H01L 21/0465* (2013.01)

(58) Field of Classification Search
CPC ............. H01L 29/518; H01L 21/28185; H01L 21/02255; H01L 21/3105; H01L 21/0223; H01L 21/02318; H01L 21/32105; H01L 21/02332; B22F 3/24; C23C 16/56
USPC .......................................................... 438/285
See application file for complete search history.

(56) References Cited

U.S. PATENT DOCUMENTS 5,219,773 A * 6/1993 Dunn .................... H01L 21/263
  257/411
8,415,671 B2 * 4/2013 Zhang ................. H01L 29/0623
  257/66
(Continued)

FOREIGN PATENT DOCUMENTS

JP        2005-116893 A     4/2005

*Primary Examiner* — Eric Ward
*Assistant Examiner* — Eric Ashbahian
(74) *Attorney, Agent, or Firm* — McGinn IP Law Group, PLLC

(57) ABSTRACT

To form a MOSFET over a silicon carbide substrate, when a heat treatment accompanied by nitration is carried out to reduce the interface state density in the vicinity of the boundary between a gate insulating film and a silicon carbide substrate, CV hysteresis occurs due to the relationship between the capacitance and gate voltage of the MOSFET, thereby reducing the reliability of a semiconductor device.

To solve the above problem, a heat treatment accompanied by nitration is carried out on the insulating film formed over the silicon carbide substrate (step S7). Then, the insulating film is heated in an inert gas atmosphere (step S9). Thereafter, a field effect transistor having a gate insulating film which is composed of the insulating film is formed over the silicon carbide substrate.

17 Claims, 14 Drawing Sheets

(51) Int. Cl.
*H01L 29/78* (2006.01)
*H01L 21/04* (2006.01)

(56) References Cited

U.S. PATENT DOCUMENTS

| | | | | |
|---|---|---|---|---|
| 2004/0229475 | A1* | 11/2004 | Bevan | H01L 21/28202 438/765 |
| 2004/0242021 | A1* | 12/2004 | Kraus | H01L 21/28202 438/776 |
| 2006/0292844 | A1* | 12/2006 | Olsen | H01L 21/28185 438/591 |
| 2007/0161214 | A1* | 7/2007 | Fompeyrine | H01L 21/28158 438/483 |
| 2007/0181980 | A1* | 8/2007 | Dyer | H01L 21/82380 257/627 |
| 2008/0050882 | A1* | 2/2008 | Bevan | H01L 21/28167 438/308 |
| 2009/0004883 | A1* | 1/2009 | Das | H01L 21/02164 438/770 |
| 2010/0065924 | A1* | 3/2010 | Lin | H01L 21/2254 257/408 |
| 2012/0217513 | A1* | 8/2012 | Tega | H01L 29/45 257/77 |
| 2013/0178031 | A1* | 7/2013 | Ramkumar | H01L 21/82341 438/287 |
| 2014/0151779 | A1* | 6/2014 | Cho | H01L 21/76224 257/316 |

* cited by examiner

METHOD FOR MANUFACTURING SEMICONDUCTOR DEVICE

CROSS-REFERENCE TO RELATED APPLICATIONS

The disclosure of Japanese Patent Application No. 2014-014508 filed on Jan. 29, 2014 including the specification, drawings and abstract is incorporated herein by reference in its entirety.

BACKGROUND

The present invention relates to a method for producing a semiconductor device and, particularly, to an effective technology which is applied to a semiconductor device including a silicon carbide semiconductor substrate.

Since silicon carbide (SiC) has a larger band gap and an approximately one-digit larger breakdown field than those of silicon (Si), it is promising as a material for use in power devices.

As a device structure to be formed over a silicon carbide substrate, a MOSFET (Metal Oxide Semiconductor Field Effect Transistor) having a trench gate structure can be microfabricated and can have low on-resistance as compared with a MOSFET having a planar structure. Therefore, it is expected to be put to practical use. It is known that, to form a gate insulating film for a MOSFET, a semiconductor substrate is thermally oxidized to form a thermal oxide film which is used as a gate insulating film.

Patent Document 1 (Japanese Unexamined Patent Application Publication No. 2005-116893) teaches that the quality of the interface of the boundary between an insulating film which includes the gate insulating film of a field effect transistor and a silicon carbide semiconductor substrate is improved by carrying out a heat treatment in a gas atmosphere accompanied by nitration after the insulating film is formed over the silicon carbide semiconductor substrate by thermal oxidation.

RELATED ART DOCUMENT

Patent Document

[Patent Document 1]
Japanese Unexamined Patent Application Publication No. 2005-116893

SUMMARY

As compared with a semiconductor device including a Si (silicon) semiconductor substrate, a field effect transistor over a silicon carbide (SiC) semiconductor substrate has a problem that the mobility of an electron is reduced due to the high interface state density of a gate insulating film. To cope with this problem, there is known a technology for reducing the interface state density by optimizing the step of forming a gate oxide film and gas annealing conditions.

More specifically, the optimization of gas annealing conditions is that an insulating film which will become a gate insulating film is annealed in a gas atmosphere accompanied by nitration. That is, annealing at the time of forming an oxide film which will become a gate insulating film or annealing after the formation of the oxide film is carried out in a gas (for example, $N_2O$ (dinitrogen monoxide) gas) atmosphere that allows nitrogen to enter the oxide film. Thereby, the interface state density at the interface between the gate insulating film and the semiconductor substrate can be reduced.

However, when this gate insulating film is annealed in a gas atmosphere accompanied by nitration, CV hysteresis occurs, thereby reducing the reliability of a semiconductor device.

When the gate insulating film of a MOSFET having a trench gate structure is formed by a thermal oxidation method, since a thermal oxide film is formed depending on the plane orientation of a semiconductor substrate, a thermal oxide film to be formed over the inner side wall of a trench has lower film formability than a thermal oxide film to be formed over the main surface of the semiconductor substrate.

Other objects and novel features will become apparent from the description of the specification and the accompanying drawings.

A brief description is subsequently given of a typical embodiment out of embodiments disclosed in the specification.

A method for producing a semiconductor device according to an embodiment of the present invention includes the steps of:

carrying out a heat treatment accompanied by nitration on an insulating film formed over a silicon carbide substrate;

heating the insulating film in an inert gas atmosphere; and forming a field effect transistor having the insulating film as a gate insulating film over the silicon carbide substrate.

According to an embodiment disclosed in the specification, the reliability of a semiconductor device can be improved. Particularly, the interface state density of a gate insulating film in a MOSFET can be reduced and the occurrence of CV hysteresis can be prevented.

DETAILED DESCRIPTION

A detailed description is subsequently given of embodiments of the present invention. In all the drawings for explaining the embodiments, members having the same function are given the same reference symbols, and repeated explanations thereof are omitted. In the following embodiments, as a general rule in principle, the explanation of the same or similar part is not repeated except when it is particularly necessary.

First Embodiment

Figure 1:
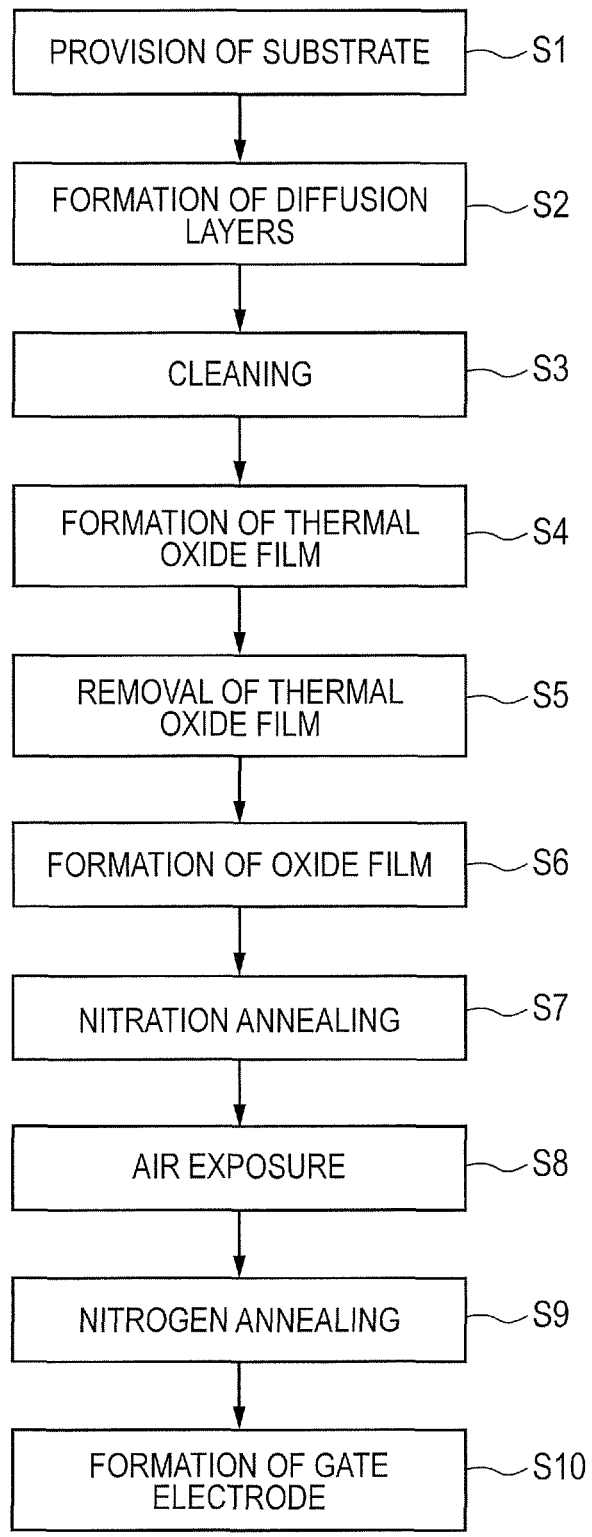
FIG. 1 shows a manufacturing process flow of a semiconductor device according to First Embodiment of the present invention.

The semiconductor device of this embodiment is a MOSFET to be formed over a silicon carbide semiconductor substrate. The method for manufacturing the semiconductor device of this embodiment is described below with reference to FIGS. 2 to 6 along with a manufacturing process flow shown in FIG. 1. FIG. 1 shows a manufacturing process flow of the semiconductor device of this embodiment. FIGS. 2 to 6 are sectional views for explaining the method for manufacturing the semiconductor device of this embodiment.

Figure 2:
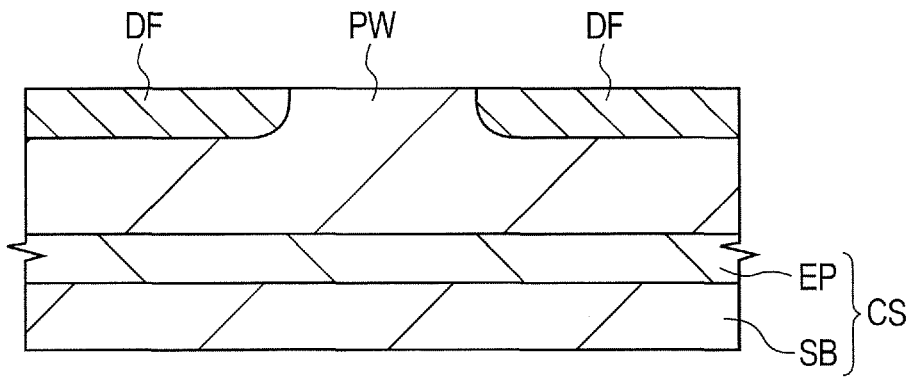
FIG. 2 is a sectional view of the method for manufacturing the semiconductor device according to First Embodiment of the present invention.

First of all, as shown in FIG. 2, a semiconductor substrate SB having an epitaxial layer EP thereover is prepared (step S1 in FIG. 1). The semiconductor substrate SB and the epitaxial layer EP are both made of silicon carbide (SiC), and an n-type impurity such as N (nitrogen), P (phosphorus) or As (arsenic) is introduced into them. More specifically, the semiconductor substrate SB is a 4H-SiC substrate.

The epitaxial layer EP is a semiconductor layer which is formed over the top surface of the semiconductor substrate SB by using an epitaxial growth method, and the concentration of the n-type impurity contained in the semiconductor substrate is higher than the concentration of the n-type impurity contained in the epitaxial layer EP. A substrate including the semiconductor substrate SB and the epitaxial layer EP formed over the semiconductor substrate SB is called "silicon carbide substrate (silicon carbide semiconductor substrate) CS" herein.

The plane orientation of the top surface of the epitaxial layer EP, that is, the main surface of the silicon carbide substrate CS is a (0001) plane. The under surface of the semiconductor substrate SB not in contact with the epitaxial layer EP is an opposite surface to the main surface of the silicon carbide substrate CS, that is, the rear surface of the silicon carbide substrate CS.

Subsequently, a p-type impurity is implanted into the top surface of the silicon carbide substrate CS in a relatively low concentration by using an ion implantation method to form a p-type well PW. The p-type impurity is, for example, Al (aluminum) or B (boron). The formation depth of the p-type well PW is shallower than the interface between the epitaxial layer EP and the semiconductor substrate SB.

Then, diffusion layers DF are formed over the top surface of the silicon carbide substrate CS (step S2 in FIG. 1). The diffusion layers DF are formed by the ion implantation of an n-type impurity from above the silicon carbide substrate CS, using a resist pattern (not shown) as a mask. The n-type impurity is, for example, N (nitrogen), P (phosphorus) or As (arsenic). In the plan view, the diffusion layers DF are arranged to sandwich a gate electrode GE (see FIG. 4) which will be formed in a later step. A pair of diffusion layers DF include the source/drain region of a MOSFET Q1 (see FIG. 4) which will be formed in a later step.

Then, the above p-type impurity is introduced into the top surface of the silicon carbide substrate CS in an unshown region in a relatively high concentration to form a p-type semiconductor layer.

Thereafter, a heat treatment is carried out to activate the n-type impurity and the p-type impurity introduced into the silicon carbide substrate CS in the above step. When the silicon carbide substrate CS is used, this heat treatment is carried out at a higher temperature, for example, 1,600° C. or higher than when an ordinary silicon substrate is used. When an activation treatment for the well PW and the diffusion layers DF is not carried out but a heat treatment for activation is carried out after the formation of a gate insulating film which will be described hereinafter, such inconvenience occurs that the film thickness of the gate insulating film changes. Therefore, in this embodiment, the activation treatment for the well PW and the diffusion layers DF is carried out prior to the formation of the gate insulating film.

Next, a cleaning step for removing an organic substance or a silicon oxide film over the surface of the silicon carbide substrate CS is carried out (step S3 in FIG. 1). Subsequently, a thermal oxide film, that is, a silicon oxide film is formed over the top surface of the silicon carbide substrate CS by heating the silicon carbide substrate CS (step S4 in FIG. 1). Thereafter, the above thermal oxide film formed over the top surface of the silicon carbide substrate CS is removed by using, for example, HF (hydrofluoric acid) (step S5 in FIG. 1). Thus, the surface state of the silicon carbide substrate CS is improved.

Figure 3:
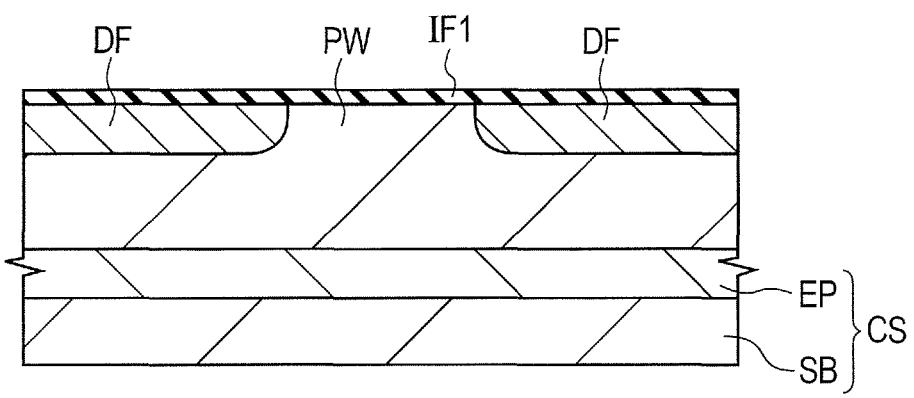
FIG. 3 is a sectional view showing the method for manufacturing the semiconductor device continued from FIG. 2.

Thereafter, as shown in FIG. 3, a silicon oxide film IF1 which is an insulating film is formed over the silicon carbide substrate CS (step S6 in FIG. 1). The silicon oxide film IF1 is formed by depositing an oxide film over the silicon carbide substrate CS at 400° C. or higher by an ALD (Atomic Layer Deposition) method using TDMAS (trisdimethylaminosilane) and $O_3$ (ozone). The silicon oxide film IF1 is made of, for example, silicon dioxide ($SiO_2$). The thickness of the silicon oxide film IF1 is, for example, about 50 nm. The silicon oxide film IF1 may be formed to a thickness of about 50 nm by a CVD (Chemical Vapor Deposition) method besides the ALD method.

It has been explained herein that the silicon oxide film IF1 is formed as a deposited oxide film by using the ALD or CVD method. The silicon oxide film IF1 maybe formed by a thermal oxidation method. When the thermal oxidation method is used, the silicon carbide substrate CS whose top is exposed is heated at 1,000° C. or higher in a oxidation gas atmosphere to form the silicon oxide film IF1 having a thickness of about 40 nm over the silicon carbide substrate CS. The above oxidation gas contains, for example, $O_2$ (oxygen) or $H_2O$ (water). That is, film formation by the thermal oxidation method can be carried out in an oxygen atmosphere or water vapor atmosphere. The oxidation gas may contain an inert gas.

Then, the silicon carbide substrate CS and the silicon oxide film IF1 are heated at 1,050° C. or higher in a gas (such as $N_2O$ (dinitrogen monoxide) gas) atmosphere accompanied by nitration (step S7 in FIG. 1). This heat treatment may be referred to as "first heat treatment" hereinafter. The gas used in this first heat treatment may be a gas except for the $N_2O$ gas if it is accompanied by nitration when the heat treatment is carried out on Si (silicon) in the above gas atmosphere. That is, NO (nitrogen monoxide) gas or $NH_3$ (ammonia) gas may be used in place of the $N_2O$ gas. In the present application, a heat treatment in a gas atmosphere accompanied by nitration may be referred to as "nitration annealing".

By carrying out the first heat treatment, for example, in a $N_2O$ gas atmosphere as descried above to nitrate part of the silicon oxide film IF1, the interface state density at the boundary between the silicon oxide film IF1 and the silicon carbide substrate CS can be reduced. It is conceivable that the mobility of an electron is reduced due to the high interface state density of a gate insulating film in a field effect transistor formed over a semiconductor substrate made of silicon carbide (SiC) as compared with a semiconductor device including a Si (silicon) semiconductor substrate. However, the interface state density is reduced by carrying out nitration annealing as described above, thereby making it possible to improve the performance of the semiconductor device.

After the temperature of the silicon carbide substrate CS is reduced to 700° C. or lower, the silicon carbide substrate CS is exposed to the atmosphere (step S8 in FIG. 1). That is, while the temperature of the silicon carbide substrate CS having the silicon oxide film IF1 is reduced, the silicon carbide substrate CS is taken out from a processing apparatus including a heat treatment device to expose the surfaces of the silicon carbide substrate CS and the silicon oxide film IF1 to the atmosphere.

After the silicon carbide substrate CS is introduced into the heat treatment device, the silicon carbide substrate CS and the silicon oxide film IF1 formed over the substrate are heated at 850° C. or higher in an inert gas (for example, $N_2$ (nitrogen) gas) atmosphere (step S9 in FIG. 1). This heat treatment may be referred to as "second heat treatment" hereinafter.

The second heat treatment step using an inert gas is a step which is carried out in order to prevent the occurrence of hysteresis characteristics in a MOSFET formed over the silicon carbide substrate CS as will be described hereinafter. As the inert gas used in the second heat treatment, Ar (argon) gas or He (helium) gas may be used in place of the $N_2$ gas.

In FIG. 1, the first heat treatment is expressed as "nitration annealing", and the second heat treatment is expressed as "nitrogen annealing". The second heat treatment may be carried out by using a gas except for the nitrogen gas as described above.

Another heat treatment step may be carried out herein prior to the second heat treatment. That is, before the second heat treatment and before or after the first treatment, the silicon carbide substrate CS may be heated in the atmosphere of a gas accompanied by nitration, such as $N_2O$ (dinitrogen monoxide) gas, NO (nitrogen monoxide) gas or $NH_3$ (ammonia) gas. After the second heat treatment, the heat treatment in a gas atmosphere accompanied by nitration is not carried out until a gate electrode GE which will be described hereinafter is formed. This is because the nitration of the silicon oxide film IF1 is prevented.

Figure 4:
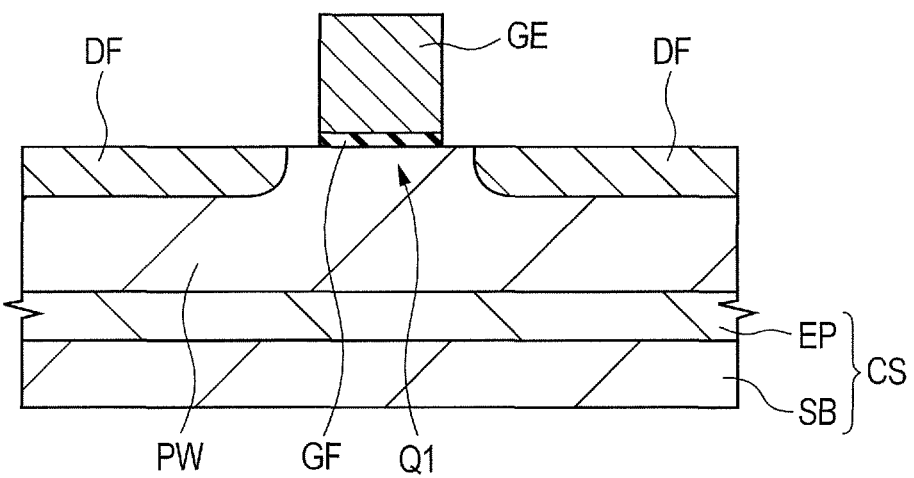
FIG. 4 is a sectional view showing the method for manufacturing the semiconductor device continued from FIG. 3.

As shown in FIG. 4, a conductive film made of polysilicon or metal is then formed over the silicon oxide film IF1. The conductive film can be formed, for example, by a CVD or sputtering method. Thereafter, photolithography and dry etching are used to process the above conductive film and the silicon oxide film IF1 to a predetermined pattern. Thereby, a gate electrode GE composed of the above conductive film is formed and a gate insulating film GF composed of the silicon oxide film IF1 is formed (step S10 in FIG. 1). BY the above steps, a MOSFETQ1 including the gate electrode GE, the gate insulating film GF and the source/drain region is formed.

Figure 5:
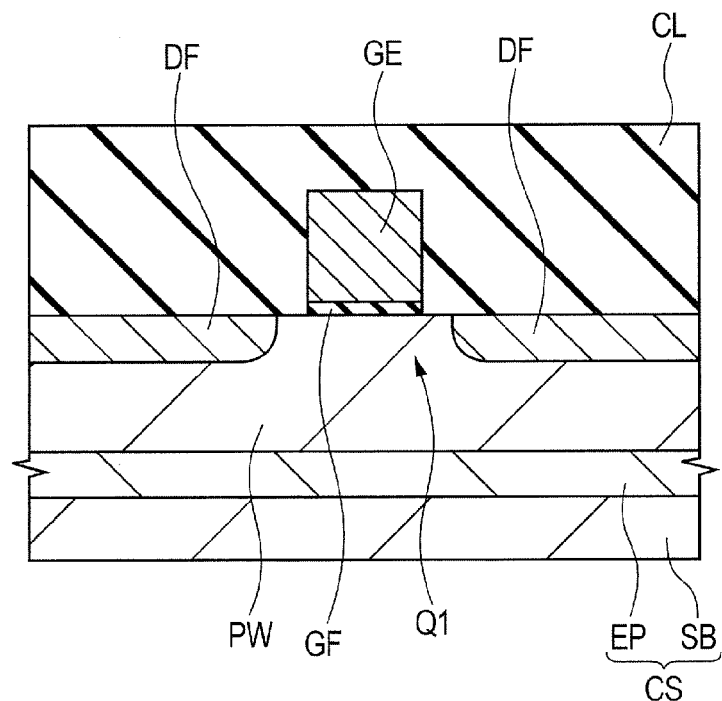
FIG. 5 is a sectional view showing the method for manufacturing the semiconductor device continued from FIG. 4.

Subsequently, as shown in FIG. 5, the MOSFETQ1 is covered with an interlayer insulating film CL. The interlayer insulating film CL composed of, for example, a silicon oxide film is formed by using a CVD method.

Figure 6:
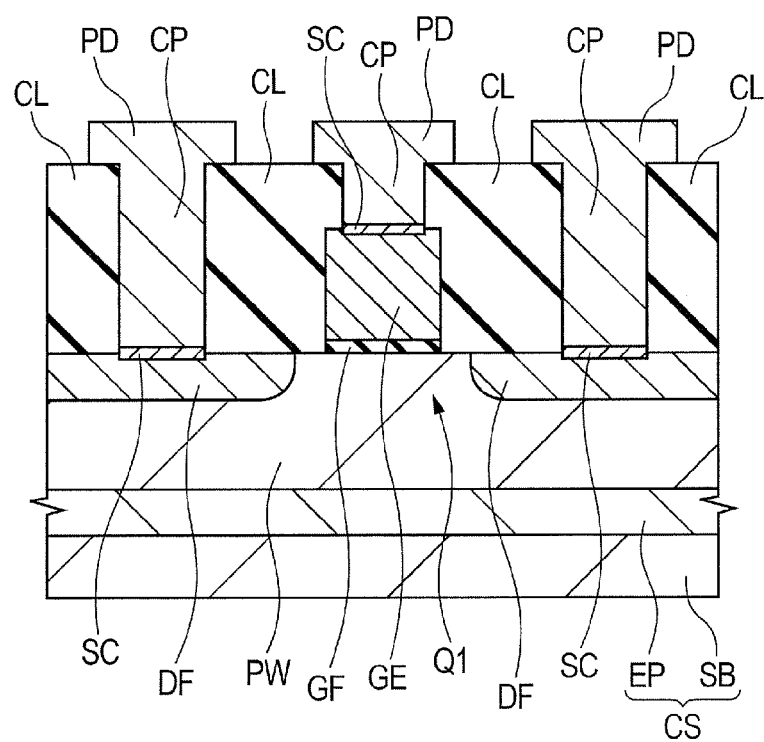
FIG. 6 is a sectional view showing the method for manufacturing the semiconductor device continued from FIG. 5.

Then, as shown in FIG. 6, a plurality of contact holes are formed in the interlayer insulating film CL by using photolithography and dry etching. Subsequently, a silicide layer SC is formed over the top surfaces of the gate electrode GE and the diffusion layers DF which are the source/drain regions at the bottoms of the contact holes by using a known technique. The silicide layer SC is made of, for example, NiSi (nickel silicide) or TiSi (titanium silicide). The silicide layer is formed as a barrier metal before the formation of a metal film which will become contact plugs CP and then heated to be reacted with the substrate.

Next, a metal film is formed over the silicon carbide substrate CB, for example, by a sputtering method to fill all the contact holes. Subsequently, the metal film is patterned by using photolithography and etching. Thereby, contact plugs CP composed of the metal film filled into the contact holes and pads PD composed of the metal film exposed onto the interlayer insulating film CL are formed.

The pads PD are electrically coupled to the gate electrode GE or the diffusion layers DF through the contact plugs CP and the silicide layer SC. The semiconductor device of this embodiment including the MOSFETQ1 is completed.

Figure 7:
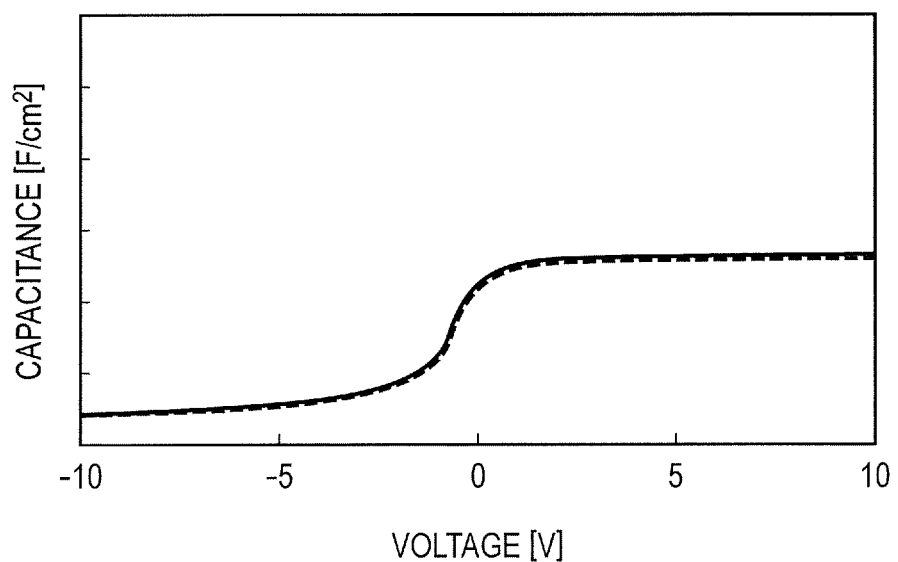
FIG. 7 is a graph showing the relationship between the capacitance and gate voltage of a MOSFET according to First Embodiment of the present invention.
Figure 8:
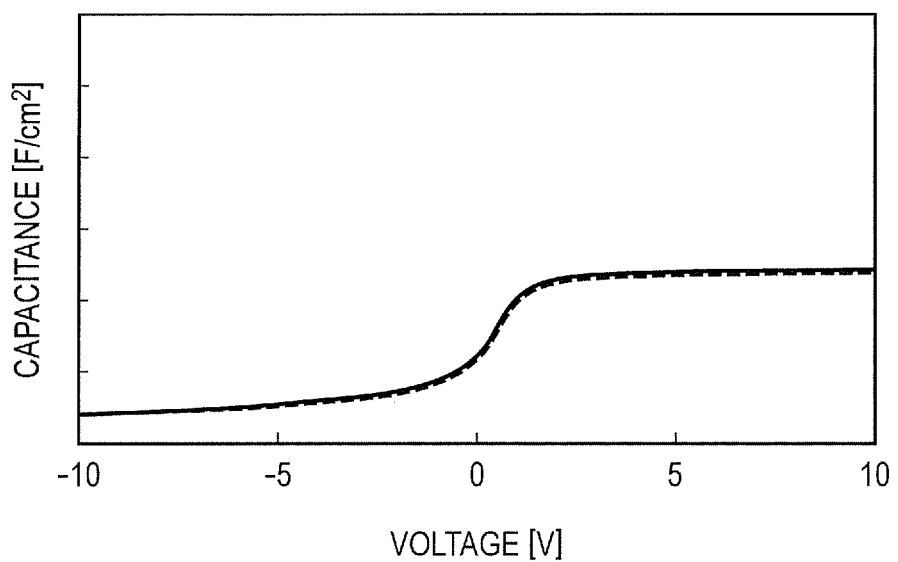
FIG. 8 is a graph showing the relationship between the capacitance and gate voltage of a MOSFET according to First Embodiment of the present invention.
Figure 9:
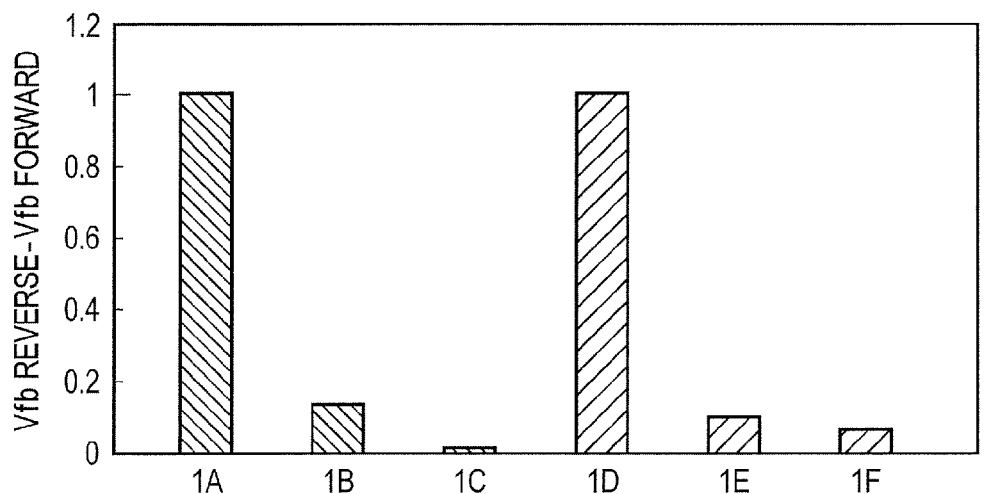
FIG. 9 is a graph for comparing the amount of hysteresis in a semiconductor device of a comparative example and the amount of hysteresis in a semiconductor device of the embodiment.
Figure 10:
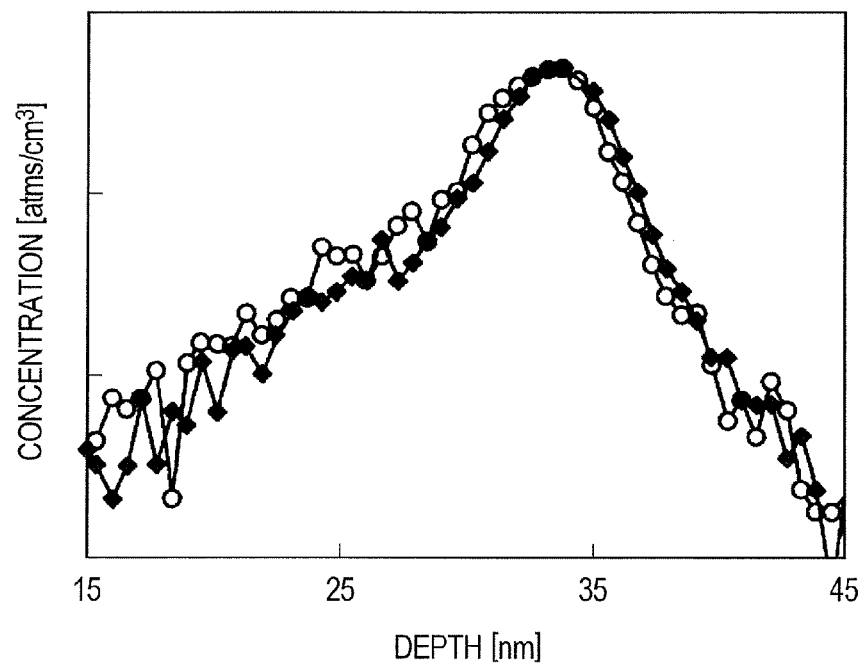
FIG. 10 is a graph showing the relationship between nitrogen concentration and depth from the top surface of a gate insulating film.
Figure 11:
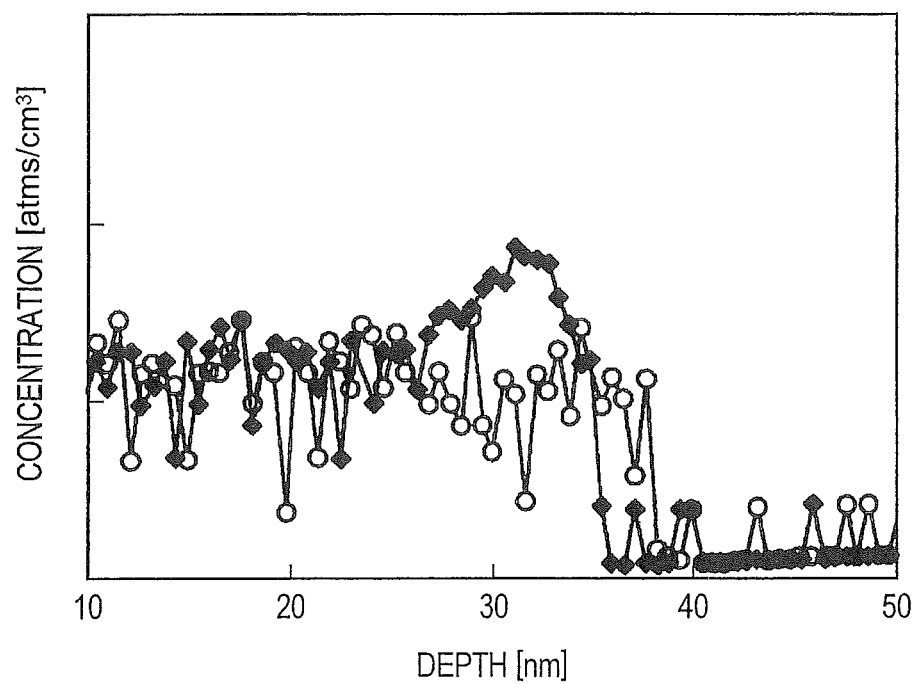
FIG. 11 is a graph showing the relationship between hydrogen concentration and depth from the top surface of a gate insulating film.
Figure 21:
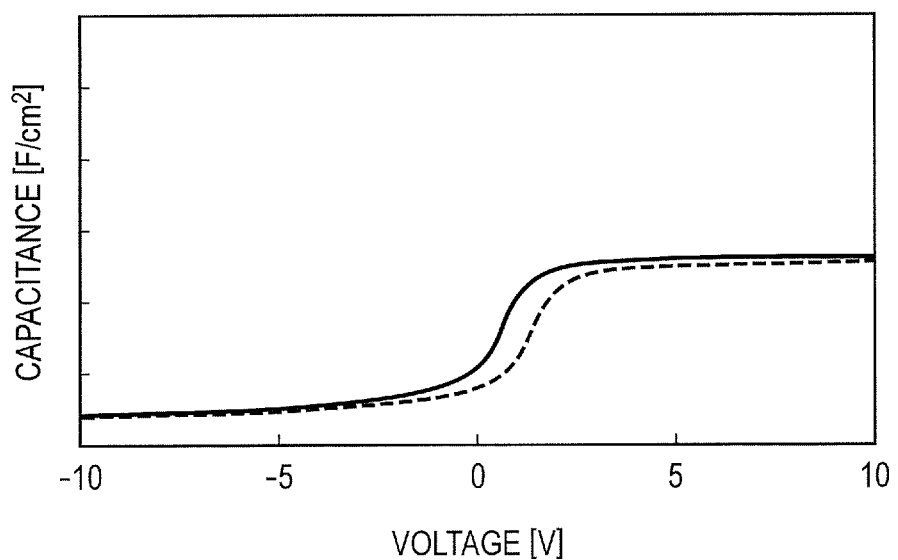
FIG. 21 is a graph showing the relationship between the capacitance and gate voltage of a MOSFET of a comparative example.
Figure 22:
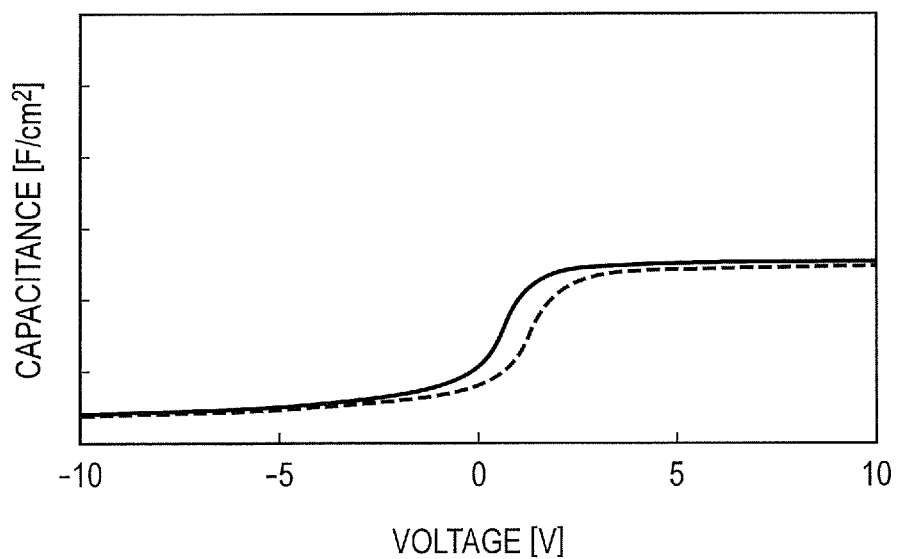
FIG. 22 is a graph showing the relationship between the capacitance and gate voltage of a MOSFET of a comparative example.

A description is subsequently given of the effect of method for manufacturing the semiconductor device of this embodiment with reference to FIGS. 7 to 11, FIG. 21 and FIG. 22. FIGS. 7 and 8 are graphs showing the CV (capacitance-voltage) characteristics of the semiconductor device of this embodiment. FIG. 9 is a graph for comparing the size of hysteresis in a plurality of semiconductor devices. FIG. 10 is a graph showing the relationship between the depth from the top surface of the gate insulating film and the distribution of N (nitrogen). FIG. 11 is a graph showing the relationship between the depth from the top surface of the gate insulating film and the distribution of H (hydrogen). FIGS. 21 and 22 are graphs showing the CV characteristics of a semiconductor device as a comparative example.

In a semiconductor device including a silicon carbide semiconductor substrate, it is conceivable that, after a deposited oxide film or thermal oxide film is formed over the silicon carbide substrate as a film including the gate insulating film of a MOSFET over the silicon carbide substrate, the oxide film is heated in a gas atmosphere accompanied by nitration. This is the same as the step 7 in FIG. 1.

When the gate insulating film is formed by processing the oxide film which has been subjected to nitration annealing as described above, the interface state density at the boundary between the gate insulating film and the silicon carbide substrate can be reduced. This is because the interface state can be reduced by terminating a dangling bond over the surface of the above oxide film by the above nitration annealing.

However, as shown in FIG. 21 and FIG. 22, when the oxide film is used as a gate insulating film without heating with an inert gas such as nitrogen after the oxide film is subjected to nitration annealing as described above, great hysteresis occurs in the CV characteristics of a MOSFET having the gate insulating film. FIG. 21 and FIG. 22 are graphs showing the characteristic properties of the semiconductor device as a comparative example, in which the capacitance per unit area between the gate electrode of the MOSFET and the semiconductor substrate is plotted on the axis of ordinate and voltage applied to the gate electrode is plotted on the axis of abscissas. That is, FIG. 21 and FIG. 22 are graphs showing the CV (capacitance-voltage) characteristics of the semiconductor device as a comparative example.

FIG. 21 shows the CV characteristics of a MOSFET when an oxide film including a gate insulating film is formed by a thermal oxidation method, subjected to nitration annealing and processed to form a gate insulating film without carrying out a heat treatment in an inert gas atmosphere. FIG. 22 shows the CV characteristics of a MOSFET when an oxide film including a gate insulating film is formed by a deposition method such as ALD, subjected to nitration annealing and processed to form a gate insulating film without carrying out a heat treatment in an inert gas atmosphere. In the graphs of FIG. 21 and FIG. 22, a case where the gate voltage is changed from the negative side to the positive side, that is, in a forward direction, is shown by a solid line and a case where the gate voltage is changed from the positive side to the negative side, that is, in a reverse direction, is shown by a broken line.

As shown in FIG. 21 and FIG. 22, there occurs a phenomenon that there is a difference in the value of capacitance between when voltage is applied in the forward direction and when voltage is applied in the reverse direction at the time of applying a predetermined range of voltage in a semiconductor device of a comparative example which has not been heated in an inert gas atmosphere after nitration annealing was carried out on the oxide film including the gate insulating film, that is, hysteresis. In the present application, this hysteresis is referred to as "CV hysteresis".

It is considered that one of the causes for the occurrence of CV hysteresis is that C (carbon) remains in the oxide film, that is, the gate insulating film over the silicon carbide substrate at the time of nitration annealing, and C (carbon) or H (hydrogen) remains at the interface between the oxide film and the silicon carbide substrate, thereby causing a trap. CV hysteresis is not observed in a MOSFET which is formed over a semiconductor substrate essentially made of Si (silicon) and rarely causes a problem but tends to occur in a MOSFET formed over a silicon carbide semiconductor substrate.

When CV hysteresis occurs, the characteristic properties of a MOSFET become unstable, thereby reducing the reliability of the semiconductor device. Since a trap for capturing an electron occurs in the gate insulating film, a leak current tends to run between the gate electrode and the semiconductor substrate through the gate insulating film, whereby a breakdown tends to occur in the gate insulating film.

When nitration annealing is carried out on an oxide film which is an insulating film formed over the silicon carbide substrate and will become a gate insulating film thereafter and then a gate insulating film is formed by processing the oxide film without carrying out a heat treatment in an inert gas atmosphere to form a MOSFET, there occurs a problem that the reliability of the semiconductor device is reduced by the occurrence of CV hysteresis and a trap in the gate insulating film.

To cope with this, the inventors of the present invention found that the interface state density can be reduced and the characteristics of CV hysteresis can be improved at the same time by carrying out a heat treatment using an inert gas such as $N_2$ (nitrogen) gas after nitration annealing. The CV characteristics of the MOSFET including the semiconductor device of this embodiment are shown in FIG. 7 and FIG. 8. FIG. 7 and FIG. 8 are graphs showing the relationship between the capacitance and gate voltage of the MOSFET like FIG. 21 and FIG. 22, respectively.

FIG. 7 shows the CV characteristics of the MOSFET when the oxide film including the gate insulating film is formed by a thermal oxidation method, subjected to nitration annealing, heated in an inert gas atmosphere and then processed to form the gate insulating film. FIG. 8 shows the CV characteristics of the MOSFET when the oxide film including the gate insulating film is formed by a deposition method such as ALD, subjected to nitration annealing, heated in an inert gas atmosphere and then processed to form the gate insulating film. In the graphs of FIG. 7 and FIG. 8, a case where voltage is applied in the forward direction is shown by a solid line and a case where voltage is applied in the reverse direction is shown by a broken line.

As shown in FIG. 7 and FIG. 8, in the MOSFET of this embodiment, the graph when the voltage is applied in the forward direction and the graph when voltage is applied in the reverse direction almost overlap with each other, and hysteresis rarely occurs. As for the CV characteristics of a comparative example shown in FIG. 21 and FIG. 22, it is understood that great hysteresis occurs since a range surrounded by the graph when voltage is applied in the forward direction and the graph when voltage is applied in the reverse direction is large and thus there is a big difference between the forward direction characteristics and the reverse direction characteristics. In contrast to this, the occurrence of hysteresis is suppressed in FIG. 7 and FIG. 8.

FIG. 9 is a graph for comparing the amount of hysteresis in the semiconductor device of a comparative example and the amount of hysteresis in the semiconductor device of this embodiment. The axis of ordinate in FIG. 9 shows $\Delta Vfb$ which is a difference between the forward direction voltage and the reverse direction voltage in the flat band voltage of the gate voltage. This figure shows a relative value of the difference $\Delta Vfb$ of the flat band voltage in the semiconductor device of this embodiment when the difference $\Delta Vfb$ of the flat band voltage in the semiconductor device of a comparative example is 1. The axis of ordinate in FIG. 9, that is, "Vfb reverse-Vfb forward" indicative of the difference ΔVfb of the flat band voltage is proportionate to the size of CV hysteresis.

FIG. 9 shows bar graphs 1A to 1F from the left. The bar graphs 1A to 1C show measurement results when the gate insulating film is formed by a thermal oxidation method, and bar graphs 1D to 1F show measurement results when the gate insulating film is formed by a deposition method such as ALD. The bar graphs 1A and 1D show the difference of the flat band voltage in a MOSFET in which the oxide film is used as a gate insulating film in the semiconductor device of a comparative example, that is, when the oxide film including the gate insulating film is subjected to nitration annealing and not heated in an inert gas atmosphere thereafter.

The bar graphs 1B, 1C, 1E and 1F show the difference of the flat band voltage in a MOSFET in which the oxide film is used as a gate insulating film in the semiconductor device of this embodiment, that is, when the oxide film including the gate insulating film is subjected to nitration annealing and then heated in an inert gas atmosphere. The bar graphs 1B and 1E show measurement results when the heat treatment (second heat treatment) is carried out in an inert gas atmosphere at 850° C., and the bar graphs 1C and 1F show measurement results when the heat treatment (second heat treatment) is carried out in an inert gas atmosphere at 1,000° C.

As shown in FIG. 9, it is understood that, when the difference between the gate voltage in the forward direction and the gate voltage in the reverse direction is 1 in the MOSFET of the comparative example, in the MOSFET of this embodiment, the above difference value becomes less than 0.15, thereby greatly reducing the amount of CV hysteresis in the bar graphs 1B, 1C, 1E and 1F. Particularly when the bar graphs 1B and 1E are compared with the bar graphs 1C and 1F, the effect of improving the CV hysteresis is larger when the heat treatment in an inert gas atmosphere is carried out at 1,000° C. than when it is carried out at 850° C.

Thus, as the temperature of the second heat treatment in an inert gas atmosphere becomes lower, the effect of improving CV hysteresis becomes smaller and as the above temperature becomes higher, the effect becomes larger. According to experimental results obtained by the inventors of the present invention, it was found that when the temperature of the second heat treatment is lower than 850° C., the effect of improving CV hysteresis becomes small and the occurrence of CV hysteresis becomes a problem. When the temperature is 1,000° C. or higher, the amount of CV hysteresis can be greatly reduced. Therefore, to prevent the occurrence of CV hysteresis, the temperature of the second heat treatment is preferably 850° C. or higher, more preferably 1,000° C. or higher.

The reason that the occurrence of hysteresis can be suppressed in the method for manufacturing the semiconductor device of this embodiment is considered to be that the heat treatment is carried out by using an inert gas such as $N_2$ (nitrogen) gas after the nitration annealing of the insulating film including the gate insulating film, thereby eliminating hydrogen from the inside of the insulating film and the vicinity of the interface between the insulating film and the silicon carbide substrate without nitrating the insulating film. FIG. 10 and FIG. 11 show the concentrations of nitrogen and hydrogen in the vicinity of the interface between the gate insulating film and the silicon carbide substrate measured by SIMS (Secondary Ion Mass Spectrometry), respectively.

FIG. 10 is a graph showing the concentration of N (nitrogen) as the axis of ordinate and the depth in a downward direction from the top surface of the oxide film including the gate insulating film as the axis of abscissas. FIG. 11 is a graph showing the concentration of H (hydrogen) as the axis of ordinate and the depth in a downward direction from the top surface of the oxide film including the gate insulating film as the axis of abscissas. That is, FIG. 10 is a graph showing the relationship between the concentration of nitrogen and the depth from the top surface of the gate insulating film, and FIG. 11 is a graph showing the relationship between the concentration of hydrogen and the depth from the top surface of the gate insulating film. Since the thickness of the oxide film including the gate insulating film is about 35 nm, in FIG. 10 and FIG. 11, the interface between the gate insulating film and the silicon carbide substrate is existent at a position where the depth as the axis of ordinate is about 35 nm. Therefore, a region shallower than a depth of about 35 nm is the inside of the oxide film and a region deeper than a depth of about 35 nm is the inside of the silicon carbide substrate.

In FIG. 10 and FIG. 11, a graph when the second heat treatment in an inert gas atmosphere is not carried out after the thermal oxide film which will become a gate insulating film is subjected to nitration annealing, that is, a graph of the comparative example is shown by interconnecting black rhombic plots. In FIG. 10 and FIG. 11, a graph when the second heat treatment in an inert gas atmosphere is carried out after the thermal oxide film which will become a gate insulating film is subjected to nitration annealing, that is, a graph of this embodiment is shown by interconnecting white circular plots.

As shown in FIG. 10, nitrogen is locally existent in the vicinity of the interface between the gate isolating film and the silicon carbide substrate in the comparative example and this embodiment. Therefore, a dangling bond in the vicinity of the interface is terminated, thereby reducing the interface state density in the vicinity of the interface. The profile of nitrogen is almost the same in the comparative example and this embodiment. That is, even when the second heat treatment is carried out by using, for example, $N_2$ (nitrogen), the oxide film is not nitrated.

In contrast to this, as shown in FIG. 11, the concentration of hydrogen in the vicinity of the interface between the gate insulating film and the silicon carbide substrate is higher in the semiconductor device of the comparative example than that of the semiconductor device of this embodiment. That is, in a region at a depth of about 32 nm, that is, in the vicinity of the above interface, the concentration of hydrogen when the second heat treatment is not carried out is higher than the concentration of hydrogen when the second heat treatment is carried out. Since hydrogen tends to diffuse and exhibits unstable behavior at the above interface, when gate voltage is applied in the forward direction or the reverse direction, hydrogen is bonded or adsorbed to or desorbed from the oxide film and the substrate in the vicinity of the interface. Therefore, it is considered that CV hysteresis occurs due to this behavior of hydrogen.

Accordingly, the reason that CV hysteresis can be improved in the method for manufacturing the semiconductor device of this embodiment in which the second heat treatment is carried out in addition to the first heat treatment is considered to be that hydrogen is desorbed and removed while nitration in the vicinity of the interface between the gate insulating film and the silicon carbide substrate is suppressed by carrying out the second heat treatment.

In the method for manufacturing the semiconductor device of this embodiment, the occurrence of CV hysteresis in a MOSFET can be prevented by forming the MOSFET in which the oxide film is used as a gate insulating film by carrying out the second heat treatment in an inert gas atmosphere (step S9 in FIG. 1) after the first heat treatment is carried out on the oxide film formed over the silicon carbide substrate in a gas atmosphere accompanied by nitration (step S7 in FIG. 1). This can prevent the characteristic properties of the MOSFET from becoming unstable and the occurrence of a leak current and a breakdown by suppressing a trap in the gate insulating film, thereby making it possible to improve the reliability of the semiconductor device.

A heat treatment accompanied by nitration is not carried out until the gate electrode GE shown in FIG. 4 is formed after the second heat treatment. This is because the effect of improving CV hysteresis is rarely obtained as the silicon oxide film IF1 (see FIG. 3) is nitrated. That is, although it is conceivable that a plurality of heat treatments may be carried out during the period from the step of forming the silicon oxide film IF1 which will become the gate insulating film GF over the silicon carbide substrate CS (step S6 in FIG. 1) to the step of forming the gate electrode GE (step S10 in FIG. 1), the second heat treatment in an inert gas atmosphere is carried out as the last of the heat treatments. Thereby, the effect of the above embodiment can be obtained.

Further, the inventors of the present invention found that CV hysteresis can be reduced effectively by exposing the oxide film and the silicon carbide substrate to the atmosphere in the step S8 in FIG. 1. Therefore, it is preferred that the first heat treatment and the second heat treatment should not be carried out continuously and that the step of exposing the silicon carbide substrate to the atmosphere after the temperature of the silicon carbide substrate is reduced to 700° C. or lower should be provided right before the second heat treatment. The reason that the temperature of the silicon carbide substrate is reduced before it is exposed to the atmosphere is that the adhesion of water or the like due to the reduction of the temperature of the silicon carbide substrate is prevented when the silicon carbide substrate having a high temperature is exposed to the atmosphere.

Figure 12:
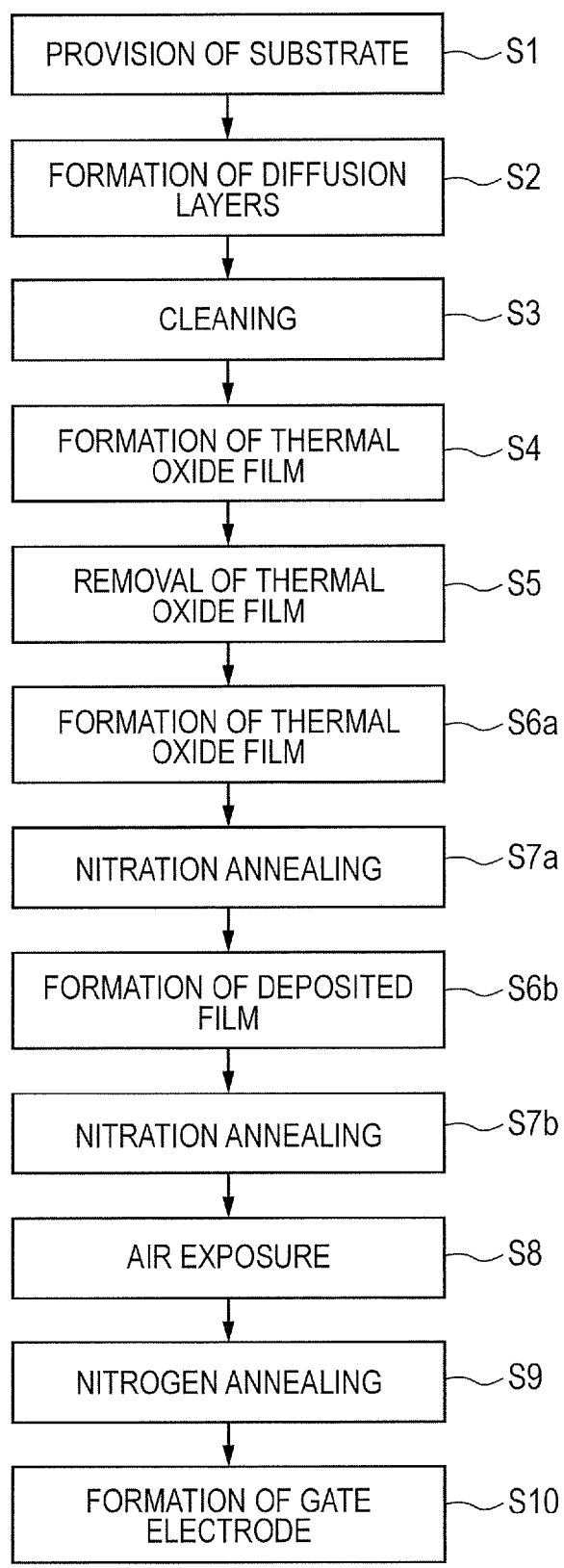
FIG. 12 shows a manufacturing process flow in a modification of the method for manufacturing the semiconductor device according to First Embodiment of the present invention.
Figure 13:
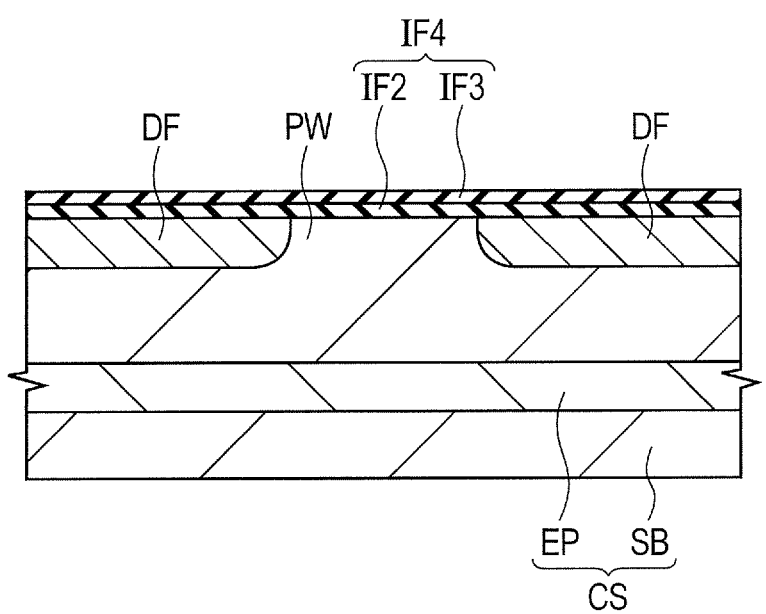
FIG. 13 is a sectional view for explaining the manufacturing process in the modification of the method for manufacturing the semiconductor device according to First Embodiment of the present invention.

A description is subsequently given of a modification of the method for manufacturing the semiconductor device of this embodiment with reference to FIG. 12 and FIG. 13. FIG. 12 shows a manufacturing process flow which is a modification of the method for manufacturing the semiconductor device of this embodiment. FIG. 13 is a sectional view for explaining the manufacturing process which is a modification of the method for manufacturing the semiconductor device of this embodiment.

In this modification, a gate insulating film is formed from an oxide film formed by a thermal oxidation method and a deposited film formed over the oxide film. As shown in FIG. 12, the steps S1 to S5 and S8 to S10 in the manufacturing process are the same as those of the manufacturing process which has been explained with reference to FIG. 1.

In this method, after the steps S1 to S5, as shown in FIG. 13, a silicon oxide film IF2 is first formed over the exposed top surface of the silicon carbide substrate CS at 1,000° C. or higher by a thermal oxidation method (step S6a in FIG. 12). This thermal oxidation may be carried out in a gas atmosphere accompanied by nitration like the above first heat treatment. Thereafter, a heat treatment is carried out in a gas atmosphere accompanied by nitration like the above first heat treatment (step S7a in FIG. 12). This heat treatment is carried out at 1,050° C. or higher.

Then, a silicon oxide film IF3 is deposited over the silicon oxide film IF2 by an ALD or CVD method (step S6b in FIG. 12). Thereby, a silicon oxide film IF4 including the silicon oxide films IF2 and IF3 which have been formed over the silicon carbide substrate CS sequentially is formed. Thereafter, like the above first heat treatment, the silicon oxide film IF4 and the silicon carbide substrate CS are heated in a gas atmosphere accompanied by nitration (step S7b in FIG. 12). This heat treatment is carried out at 1,050° C. or higher.

Thereafter, like the process shown in FIG. 1, after the silicon carbide substrate CS is exposed to the atmosphere (step S8 in FIG. 12) and heated in an inert gas atmosphere (step S9 in FIG. 12), the step S10 and the subsequent steps in FIG. 1 are carried out to form a MOSFET. The difference between the completed MOSFET of this modification and the MOSFETQ1 shown in FIG. 6 is that the gate insulating film of this modification has a laminate structure including the thermal oxide film and the deposited film.

In the process shown in FIG. 12, after the step S6a in which the thermal oxide film has been formed, nitration annealing is carried out (step S7a in FIG. 12). However, the deposited film forming step as the step S6b may be carried out after the formation of the thermal oxide film without carrying out this nitration annealing. This is because the interface state density at the interface between the silicon oxide film IF2 and the silicon carbide substrate CS can be reduced by nitrating the silicon oxide film IF2 even when nitration annealing is carried out after the silicon oxide films IF2 and IF3 shown in FIG. 13 are formed. In order to obtain the effect of the above embodiment herein, a heat treatment step in an inert gas atmosphere (step S9 in FIG. 12) must be carried out on the laminated oxide film which has been subjected to nitration annealing (step S7b in FIG. 12).

In addition to the steps shown in FIG. 12, the same steps as the steps of exposing to the atmosphere and heating in an inert gas atmosphere (step S8 and step S9 in FIG. 12) may be carried out between the step S7a and the step S6b. That is, after the step of exposure to the atmosphere and the step of carrying out a heat treatment in an inert gas atmosphere are carried out after the step of forming a thermal oxide film (step S6a), the step of forming a deposited film (step S6b) is carried out and then nitration annealing (step S7b), exposure to the atmosphere (step S8) and a heat treatment in an inert gas atmosphere (step S9) may be carried out sequentially. Thereby, a large amount of hydrogen can be desorbed from the silicon oxide film IF4, thereby making it possible to suppress the occurrence of hysteresis.

As described above, even when the gate insulating film is to be formed by laminating together the silicon oxide film IF2 formed by the thermal oxidation method and the silicon oxide film IF3 formed by the deposition method, the method for manufacturing the semiconductor device of this embodiment can be employed. Although a nitration annealing step may be provided besides nitration annealing in the step S7b shown in FIG. 12 herein, it is necessary to carry out the step of heating in an inert gas atmosphere (step S9 in FIG. 12) in the end after a plurality of nitration annealing steps in order to prevent the nitration of the silicon oxide film IF4 and remove hydrogen in the vicinity of the interface between the silicon oxide film IF4 and the silicon carbide substrate CS.

When the interface state density at the interface between the thermal oxide film (silicon oxide film IF2) and the silicon carbide substrate CS can be fully reduced by the nitration annealing of the step S7a shown in FIG. 12, it is not necessary to carry out the nitration annealing of the step S7b.

Second Embodiment

Figure 14:
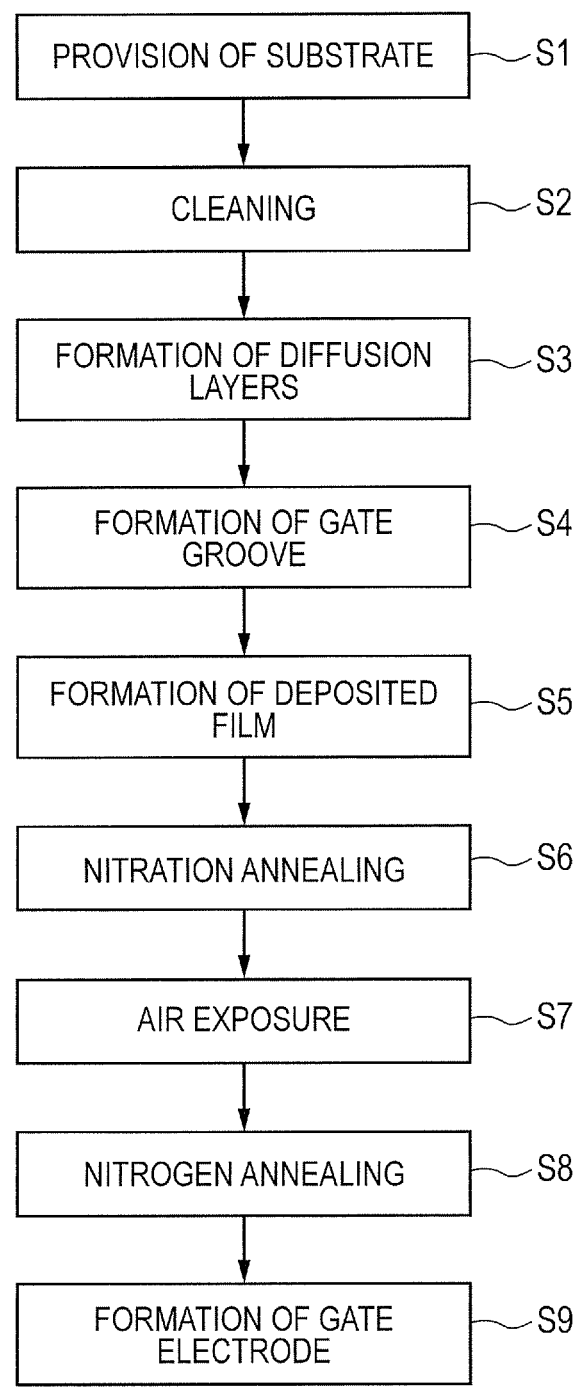
FIG. 14 shows a manufacturing process flow of a semiconductor device according to Second Embodiment of the present invention.

Unlike the above First Embodiment, the method for manufacturing a semiconductor device of this embodiment is the method for manufacturing a MOSFET having a trench type gate structure. A description is subsequently given of the method for manufacturing the semiconductor device of this embodiment with reference to FIGS. 15 to 20 along with a manufacturing process flow shown in FIG. 14. FIG. 14 shows a manufacturing process flow of the semiconductor device of this embodiment. FIGS. 15 to 20 are sectional views for explaining the method for manufacturing the semiconductor device of this embodiment.

Figure 15:
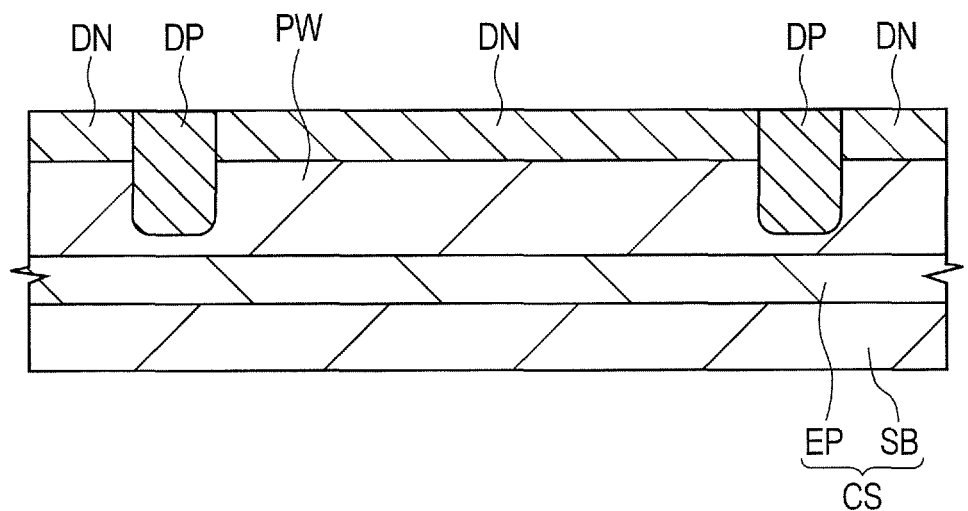
FIG. 15 is a sectional view showing the method for manufacturing the semiconductor device according to Second Embodiment of the present invention.

As shown in FIG. 15, the silicon carbide substrate CS is first prepared (step S1 in FIG. 14). Subsequently, the top surface of the silicon carbide substrate CS is cleaned (step S2 in FIG. 14). The plane orientation of the top surface of the silicon carbide substrate CS is a (0001) plane.

Then, a p-type well PW is formed in the same manner as the step which has been explained with reference to FIG. 2. Thereafter, diffusion layers DN and DP are formed in the predetermined region of the top surface of the silicon carbide substrate CS by an ion implantation method using photolithography (step S3 in FIG. 14). The diffusion layer DN is an n-type semiconductor layer formed by introducing an n-type impurity (such as N (nitrogen), P (phosphorus) or As (arsenic)) into the top surface of the silicon carbide substrate CS in a relatively high concentration. The diffusion layers DP are p-type semiconductor layers formed by introducing a p-type impurity (such as Al (aluminum) or B (boron)) into the top surface of the silicon carbide substrate CS in a relatively high concentration. The diffusion layers DN and DP are formed by using different resist patterns as masks in separate steps.

As shown in FIG. 15, the diffusion layer DN is formed over the exposed top surface of the silicon carbide substrate CS, that is, the entire surface of an active region. A pair of the diffusion layers DP are formed to sandwich a region in which a gate electrode will be formed in a later step. The formation depth of the diffusion layers DP is deeper than that of the diffusion layer DN, and the formation depths of the diffusion layers DN and DP are shallower than the formation depth of the p-type well PW.

Figure 16:
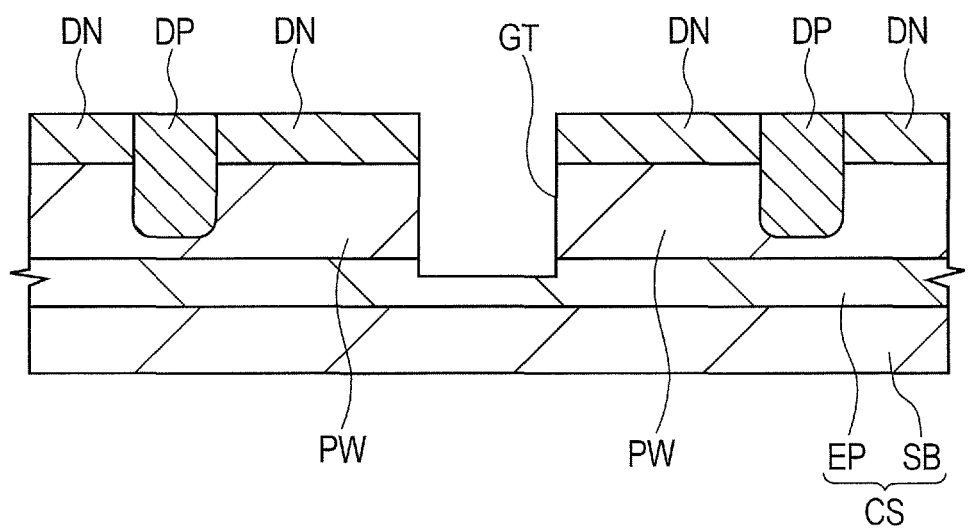
FIG. 16 is a sectional view showing the method for manufacturing the semiconductor device continued from FIG. 15.

Then, as shown in FIG. 16, a gate groove GT is formed in the top surface of the silicon carbide substrate CS by using photolithography and dry etching (step S4 in FIG. 14). The gate groove GT is formed at a position away from the diffusion layers DP in a region sandwiched between the pair of the diffusion layers DP. That is, the diffusion layer DN is formed over the top surface of the silicon carbide substrate CS adjacent to the inner side wall of the gate groove GT but the diffusion layers DP are not. The diffusion layer DN is formed over the side wall of the silicon carbide substrate CS exposed to the inner side wall of the gate groove GT.

The depth of the gate groove GT is deeper than the formation depth of the p-type well PW and shallower than the interface between the epitaxial layer EP and the semiconductor substrate SB. That is, the bottom surface of the gate groove GT reaches the halfway depth of the epitaxial layer EP. Since the bottom surface of the gate groove GT is parallel to the main surface of the silicon carbide substrate CS, the plane orientation of the bottom surface is a (0001) plane. In contrast to this, the plane orientation of the side wall of the silicon carbide substrate CS which is the inner side wall of the gate groove GT is a (11-20) plane. The gate groove GT is formed, for example, by dry etching using a hard mask pattern (not shown) formed over the silicon carbide substrate CS as a mask.

Figure 17:
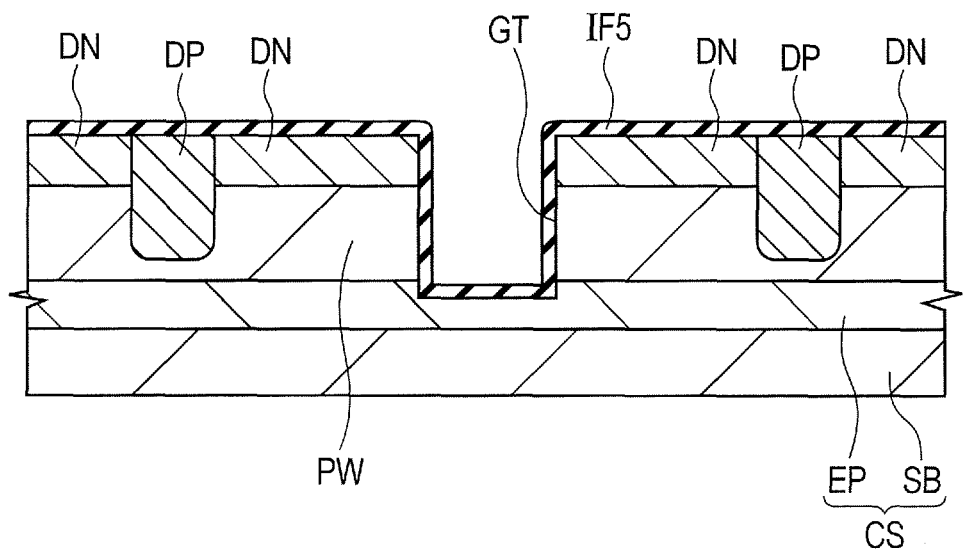
FIG. 17 is a sectional view of the method for manufacturing the semiconductor device continued from FIG. 16.

Then, as shown in FIG. 17, a silicon oxide film IF5 which is a deposited film is formed over the silicon carbide substrate CS by using an ALD or CVD method (step S5 in FIG. 14). The silicon oxide film IF5 is formed in contact with the main surface of the silicon carbide substrate CS and the bottom surface of the gate groove GT both of which are (0001) planes and in contact with the side wall of the silicon carbide substrate CS which is the inner side wall of the gate groove GT as a (11-20) plane.

Then, like the steps S7 to S9 in FIG. 1, nitration annealing which is the first heat treatment (step S6 in FIG. 14), air exposure (step S7 in FIG. 14) and a heat treatment in an inert gas atmosphere which is the second heat treatment (step S8 in FIG. 14) are carried out on the silicon carbide substrate CS and the silicon oxide film IF5 sequentially. Thereby, a structure shown in FIG. 17 is obtained.

Figure 18:
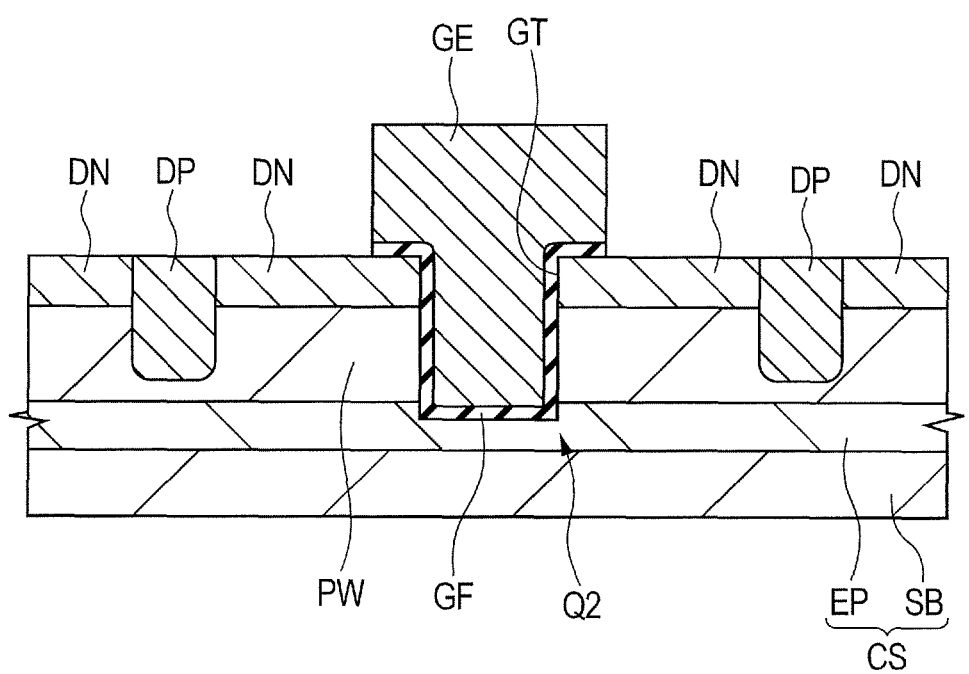
FIG. 18 is a sectional view of the method for manufacturing the semiconductor device continued from FIG. 17.

Then, as shown in FIG. 18, like the step S10 in FIG. 1, a gate electrode GE and a gate insulating film GF are formed (step S9 in FIG. 14). The gate electrode GE is composed of a conductive film such as a polysilicon film deposited by the CVD method over the silicon oxide film IF5 (see FIG. 17). The conductive film is formed to fill the gate groove GT. Thereafter, the conductive film and the silicon oxide film IF5 are patterned to form the gate electrode GE which is composed of the conductive film and the gate insulating film GF which is composed of the silicon oxide film IF5.

The gate electrode GE and the gate insulating film GF have such a pattern shape that exposes the pair of the diffusion layers DP. Therefore, the diffusion layers DP and the diffusion layer DN adjacent to the diffusion layers DP are exposed from the gate electrode GE and the gate insulating film GF. In other words, the gate electrode GE and the gate insulating film GF cover part of the diffusion layer DN adjacent to the gate groove GT between the gate groove GT and the diffusion layers DP. The gate electrode GE is a so-called "trench gate electrode" which is buried in the gate groove GT formed in the top surface of the silicon carbide substrate CS.

As will be described hereinafter, the semiconductor device which is manufactured in this embodiment is a vertical n-channel MOSFET having an electrode on the rear side of the silicon carbide substrate CS, that is, a trench type MOSFET. That is, the diffusion layer DN and the n-type layer in the semiconductor substrate SB include the source/drain region of the MOSFET. By the above steps, a MOSFET Q2 having the gate electrode GE, the gate groove GT and the source/drain region which is composed of the diffusion layer DN and the n-type layer in the semiconductor substrate SB is formed. The diffusion layers DP are semiconductor layers for electrically coupling some of contact plugs which will be described hereinafter to the silicon carbide substrate CS and grounding them.

Figure 19:
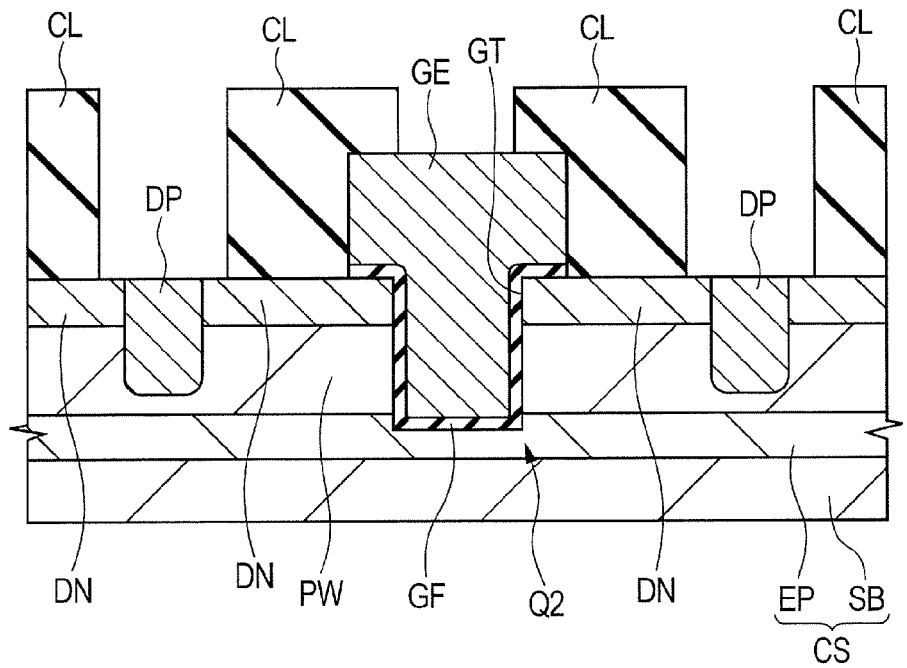
FIG. 19 is a sectional view of the method for manufacturing the semiconductor device continued from FIG. 18.

Then, as shown in FIG. 19, an interlayer insulating film CL is formed over the silicon carbide substrate CS and the gate electrode GE by using the CVD method. Subsequently, a plurality of contact holes penetrating through the interlayer insulating film CL are formed by using photolithography and dry etching. One contact hole exposes the top surface of the gate electrode GE and the other contact holes expose the respective paired diffusion layers DP and the diffusion layer DN adjacent to these diffusion layers DP. The top surface of one diffusion layer DP and the top surface of the diffusion layer DN adjacent to the diffusion layer DP are exposed to the bottom part of each of the other contact holes.

Not shown herein, a liner insulating film which may be used as an etching stopper film may be formed between the silicon carbide substrate CS and the interlayer insulating film CL and between the gate electrode GE and the interlayer insulating film CL.

Figure 20:
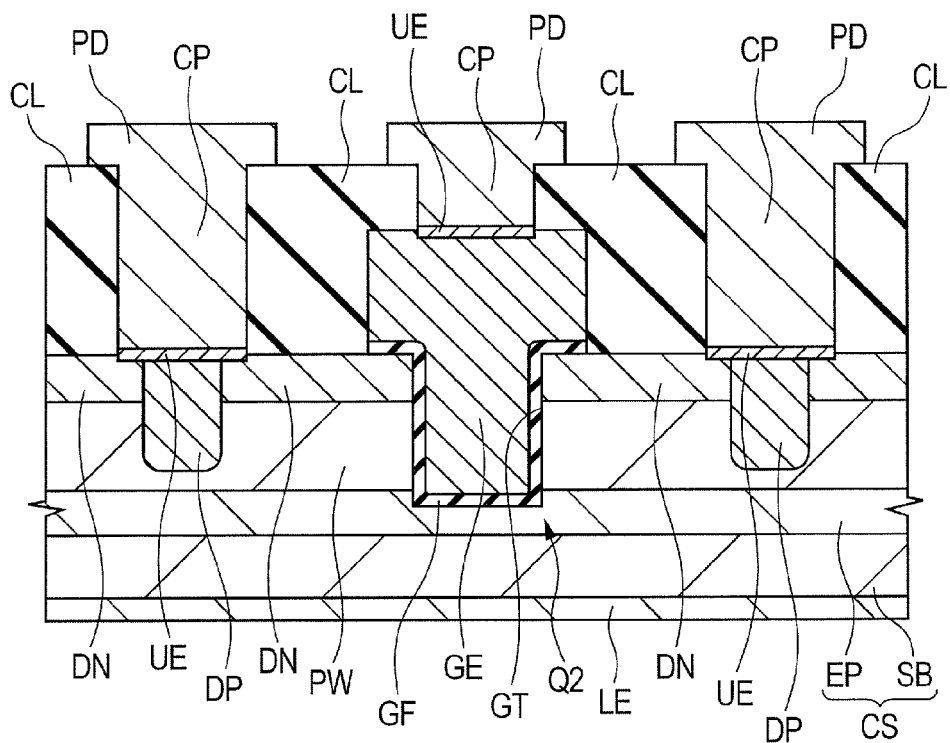
FIG. 20 is a sectional view of the method for manufacturing the semiconductor device continued from FIG. 19.

Then, as shown in FIG. 20, an upper electrode UE is formed over the top surfaces of the gate electrode GE and the diffusion layers DP and DN exposed from the contact holes. That is, the upper electrode UE is formed at the bottoms of the contact holes. The upper electrode UE is, for example, composed of a silicide layer. Contact plugs CP formed on the both sides of the gate electrode GE are electrically coupled to both of the diffusion layer DN and the diffusion layers DP through the upper electrode UE at the bottom.

Then, as in the step which has been explained with reference to FIG. 6, the contact plugs CP which will fill the contact holes and pads PD over the contact plugs CP are formed. Thereafter, a lower electrode LE which is composed of a conductive film is formed on the rear side of the silicon carbide substrate CS. The lower electrode LE is composed of, for example, a silicide layer or a metal layer. The semiconductor device of this embodiment is completed by this.

Figure 23:
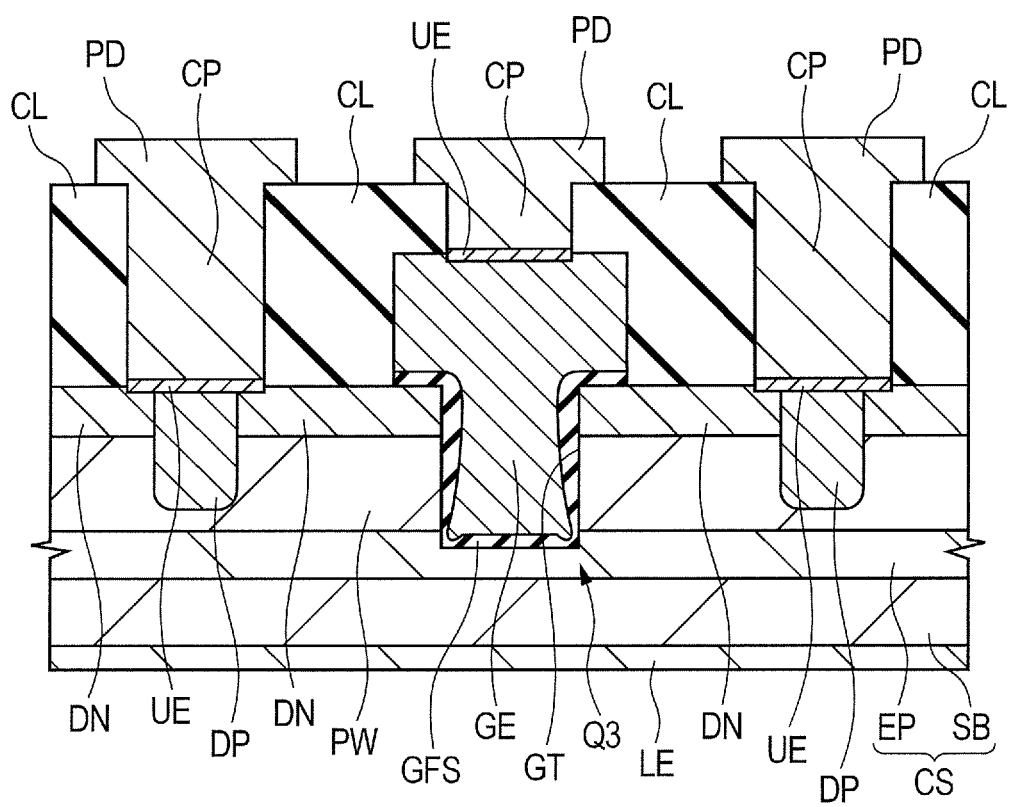
FIG. 23 is a sectional view of the semiconductor device of a comparative example.

A description is subsequently given of the effect of the method for manufacturing the semiconductor device of this embodiment with reference to FIG. 23. FIG. 23 is a sectional view of a vertical MOSFET which is a semiconductor device of a comparative example. The gate insulating film GF is composed of a deposited film in the semiconductor device of this embodiment shown in FIG. 20 whereas a gate insulating film GFS is composed of a thermal oxide film alone in the semiconductor device of this comparative example.

In the method for manufacturing the semiconductor device of this embodiment, the same effect as that of the above First Embodiment can be obtained by carrying out a heat treatment in an inert gas atmosphere (second heat treatment) after the silicon oxide film formed over the silicon carbide substrate is subjected to nitration annealing (first heat treatment) as in the steps S7 to S9 shown in FIG. 1. That is, the interface state density can be reduced by carrying out the first heat treatment, and the occurrence of CV hysteresis can be prevented by carrying out the second heat treatment.

Although the silicon oxide film IF5 (see FIG. 17) including the gate insulating film is formed as a deposited film by the deposition method in this embodiment, the above effect can be obtained even when the silicon oxide film IF5 is formed by the thermal oxidation method. Like the above modification of First Embodiment which has been explained with reference to FIG. 12 and FIG. 13, the silicon oxide film IF5 may be composed of a laminate film including a thermal oxide film and a deposited film.

When the gate insulating film is formed by the thermal oxidation method in a vertical MOSFET in which a groove is formed in the top surface of the silicon carbide substrate and a trench gate electrode is formed in the groove, the gate insulating film is grown depending on the plane orientation of the surface of the silicon carbide substrate. Therefore, there is a problem that the coverage of the gate insulating film in the groove becomes poor. FIG. 23 shows a vertical MOSFETQ3 having the gate insulating film GFS which is composed of a thermal oxide film.

The thickness of the gate insulating film GFS formed by the thermal oxidation method depends on the plane orientation of the silicon carbide substrate CS in contact with the thermal oxide film including the gate insulating film GFS. As shown in FIG. 23, as compared with part of the gate insulating film GFS which is formed in contact with the main surface of the silicon carbide substrate CS and the bottom surface of the gate groove GT all of which are (0001) planes, the gate insulating film GFS formed in contact with the side wall of the silicon carbide substrate CS which is the inner side wall of the gate groove GT as a (11-20) plane grows quickly by the thermal oxidation method as a thermal oxide film. Therefore, part of the gate insulating film GFS formed in contact with the side wall of the silicon carbide substrate CS which is the inner side wall of the gate groove GT is thicker than part of the gate insulating film GFS formed in contact with the main surface of the silicon carbide substrate CS and the bottom surface of the gate groove GT.

When the oxide film is formed dependent on plane orientation, as shown in FIG. 23, the thickness of the gate insulating film GFS becomes extremely small in the vicinity of the boundary between the side wall and the bottom part of the gate groove GT. In the vertical MOSFET having the gate insulating film GFS which is not uniform in thickness, the pressure resistances of the silicon carbide substrate CS and the gate electrode GE lower, thereby reducing the reliability of the semiconductor device.

Since the silicon oxide film formed by the deposition method such as ALD or CVD method has no dependence on the plane orientation of the semiconductor substrate, it can cover the surface of the silicon carbide substrate within and outside of the gate groove with more uniform thickness. However, as the deposited oxide film may have lower density than that of the thermal oxide film, it is conceivable that when it is used as a gate insulating film, its reliability is low from the viewpoint of the prevention of a trouble such as a leak current or a breakdown.

In contrast to this, since the interface state density in the vicinity of the interface between the gate insulating film GF and the silicon carbide substrate CS shown in FIG. 20 can be reduced and the occurrence of CV hysteresis can be prevented in this embodiment, the reliability of the gate insulating film formed by the deposition method can be enhanced. Thereby, the reliability of the deposited oxide film which can be formed uniform in thickness can be enhanced without depending on the plane orientation of the substrate, thereby making it possible to improve the reliability of a semiconductor device.

While preferred embodiments of the invention made by the inventors of the present invention have been described above, it is needless to say that the present invention is not limited thereto and that changes and modification maybe made without departing from the spirit or scope of the invention.

What is claimed is:

1. A method for manufacturing a semiconductor device, comprising:
preparing a silicon carbide substrate;
forming a source/drain region in the silicon carbide substrate;
forming a first insulating film over the top surface of the silicon carbide substrate;
carrying out a first heat treatment accompanied by nitration on the first insulating film and the silicon carbide substrate in a first gas atmosphere;
after the carrying out of the first heat treatment and after a temperature of the silicon carbide substrate has become 700° C. or less, removing the silicon carbide substrate from a processing apparatus and exposing the silicon carbide substrate to air in an atmosphere outside of the processing apparatus;

after the exposing of the silicon carbide substrate to air in the atmosphere, carrying out a second heat treatment on the first insulating film and the silicon carbide substrate in a second gas atmosphere which is an inert gas; and after the carrying out of the second heat treatment, forming a gate electrode through the first insulating film over the silicon carbide substrate, wherein the gate electrode, the first insulating film and the source/drain region include a field effect transistor.

2. The method for manufacturing a semiconductor device according to claim 1, wherein the forming of the first insulating film comprises performing a heat treatment on the silicon carbide substrate to form the first insulating film over the top surface of the silicon carbide substrate.

3. The method for manufacturing a semiconductor device according to claim 2, wherein the performing of the heat treatment is carried out in an atmosphere comprising at least one member selected from the group consisting of oxygen and vapor.

4. The method for manufacturing a semiconductor device according to claim 1, wherein the first insulating film is formed by using an ALD or CVD method in the forming of the first insulating film.

5. The method for manufacturing a semiconductor device according to claim 1, wherein the forming of the first insulating film comprises:

performing a heat treatment on the silicon carbide substrate to form an insulating film over the top surface of the silicon carbide substrate, and forming an other insulating film over the insulating film by using an ALD or CVD method, to form the first insulating film including the insulating film and the other insulating film.

6. The method for manufacturing a semiconductor device according to claim 5, further comprising:

after the performing of the heat treatment and before the forming of the other insulating film, carrying out a heat treatment accompanied by nitration on the insulating film and the silicon carbide substrate in the first gas atmosphere.

7. The method for manufacturing a semiconductor device according to claim 1, wherein the first gas comprises at least one member selected from the group consisting of dinitrogen monoxide, nitrogen monoxide and ammonia gases.

8. The method for manufacturing a semiconductor device according to claim 1, wherein the second gas comprises at least one member selected from the group consisting of nitrogen, argon and helium gases.

9. The method for manufacturing a semiconductor device according to claim 1, wherein the second heat treatment is carried out at 850 °C. or higher.

10. The method for manufacturing a semiconductor device according to claim 1, further comprising:

after the preparing of the silicon carbide substrate and before the forming of the source/drain region, forming a groove in the main surface of the silicon carbide substrate, wherein the gate electrode is formed in the groove in the forming of the gate electrode.

11. The method for manufacturing a semiconductor device according to claim 1, wherein the second heat treatment is carried out at 1000° C. or greater.

12. A method for manufacturing a semiconductor device, comprising:

preparing a silicon carbide substrate;

forming a first insulating film over the top surface of the silicon carbide substrate;

carrying out a first heat treatment accompanied by nitration on the first insulating film and the silicon carbide substrate in a first gas atmosphere; and after the carrying out of the first heat treatment, and after a temperature of the silicon carbide substrate has become 700° C. or less, removing the silicon carbide substrate from a processing apparatus and exposing the silicon carbide substrate to air in an atmosphere outside of the processing apparatus;

after the exposing of the silicon carbide substrate to air in the atmosphere, carrying out a second heat treatment on the first insulating film and the silicon carbide substrate in a second gas atmosphere which comprises an inert gas.

13. The method of claim 12, further comprising:

before the forming of the first insulating film, forming a source/drain region in the silicon carbide substrate.

14. The method of claim 12, further comprising:

after the carrying out of the second heat treatment, patterning the first insulating film to form a gate insulating film.

15. A method for manufacturing a semiconductor device, comprising:

preparing a silicon carbide substrate;

forming a first insulating film on the silicon carbide substrate;

carrying out a first heat treatment accompanied by nitration on the first insulating film and the silicon carbide substrate in a first gas atmosphere;

after the carrying out of the first heat treatment and after a temperature of the silicon carbide substrate has become 700° C. or less, removing the silicon carbide substrate from a processing apparatus and exposing the first insulating film and the silicon carbide substrate to air in an atmosphere outside of the processing apparatus;

after the removing of the silicon carbide substrate from a processing apparatus and the exposing of the silicon carbide substrate to air in the atmosphere, carrying out a second heat treatment on the first insulating film and the silicon carbide substrate in a second gas atmosphere which comprises an inert gas, the second heat treatment is carried out at 850° C. or greater; and after the carrying out of the second heat treatment, patterning the first insulating film to form a gate insulating film.

16. The method for manufacturing a semiconductor device according to claim 1, further comprising:

after the preparing of the silicon carbide substrate and before the forming of the source/drain region, forming a groove in the main surface of the silicon carbide substrate, the gate electrode being formed in the groove in the forming of the gate electrode; and after the carrying out of the second heat treatment, patterning the first insulating film to form a gate insulating film.

17. The method for manufacturing a semiconductor device according to claim 16, wherein the forming of the first insulating film comprises:

performing a heat treatment on the silicon carbide substrate to form an insulating film over the top surface of the silicon carbide substrate, and forming an other insulating film over the insulating film by using an ALD or CVD method, to form the first insulating film including the insulating film and the other insulating film.

* * * * *